(12) United States Patent
Ruha

(10) Patent No.: US 6,407,532 B1
(45) Date of Patent: Jun. 18, 2002

(54) METHOD AND APPARATUS FOR MEASURING BATTERY CHARGE AND DISCHARGE CURRENT

(75) Inventor: Antti Ruha, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/772,249

(22) Filed: Jan. 29, 2001

Related U.S. Application Data

(60) Provisional application No. 60/259,110, filed on Dec. 29, 2000.

(51) Int. Cl.[7] .................... H01M 10/44; H01M 10/46
(52) U.S. Cl. ..................................... 320/128; 320/137
(58) Field of Search ............................. 320/127, 128, 320/132, 135, 137, 157, 162, 164

(56) References Cited

U.S. PATENT DOCUMENTS 5,119,011 A * 6/1992 Lambert
5,672,951 A * 9/1997 Shiota
6,064,185 A * 5/2000 Ohno \* cited by examiner Primary Examiner—Edward H. Tso
(74) Attorney, Agent, or Firm—Harrington & Smith, LLP

(57) ABSTRACT

Disclosed is a method for charging a battery and circuitry for performing the method. The method includes steps of: (a) generating a charging current (Ich) for a battery; (b) generating a replica current (Irep) of Ich, where Irep=Ich/N, where N>1; (c) measuring a voltage drop induced by Irep across a measurement resistance; and (d) using the measured voltage drop for controlling a magnitude of Ich. Preferably N is greater than about 10, more preferably N is greater than about 100, and in the most preferred embodiment N is in a range of about 100 to about 1000. The step of generating the charging current (Ich) includes a step of operating a first device having an input node coupled to a source of charging current, the step of generating the replica current (Irep) includes a step of operating a second device having an input node coupled to the source of charging current; wherein the first device and the second device are both driven with the same control signal. The control signal may be a pulse width modulated signal having a pulse width that is controlled as a function of the measured voltage drop across the measurement resistance, or a DC voltage having an adjustable voltage value. In the preferred embodiment the step of generating the replica current (Irep) includes a step of operating a servo loop to force a potential appearing at an output node of the second device to equal a potential appearing at an output node of the first device. A battery discharge measurement circuit is also disclosed, and operates in accordance with the same principles as the battery charging circuit.

25 Claims, 2 Drawing Sheets

METHOD AND APPARATUS FOR MEASURING BATTERY CHARGE AND DISCHARGE CURRENT

CLAIM OF PRIORITY FROM A COPENDING PROVISIONAL PATENT APPLICATION

Priority is herewith claimed under 35 U.S.C. §119(e) from copending provisional patent application No. 60/259,110, filed on Dec. 29, 2000 with Express Mail No.: EL 562 863 469 US, entitled METHOD AND APPARATUS FOR MEASURING BATTERY CHARGE AND DISCHARGE CURRENT by Antti Ruha.

FIELD OF THE INVENTION

This invention relates generally to battery charging circuitry and methods and, more particularly, relates to methods and apparatus for measuring a battery charging current, as well as a battery discharging current.

BACKGROUND OF THE INVENTION

A battery charging circuit of most interest to these teachings is one used with a wireless terminal, also referred to as mobile station or as a personal communicator. During a charging operation a relatively high current is required to be measured and monitored, typically in the range of several hundred milliamps (mA) or even more. Referring to FIG. 1, conventional practice places a series resistance (Rmeas) between a source of charging current, shown as a charger 1, and the associated charger switch (Msw) 2. Msw is coupled to the battery 3 to be recharged. The battery charging current (Ich) flows through Rmeas, and the resulting voltage drop (Vmeas) across Rmeas is sensed for controlling the charging cycle. For example, an analog-to-digital converter (ADC) 4 may be used to convert Vmeas to an a digital representation, which in turn may be used to modulate the pulse width of a signal output from a pulse width modulator (PWM) 5. Vmeas may also be employed as a measurement of the battery voltage. The output of the PWM 5 can be used directly, or it can be further modified by a charging controller 6, to provide a switching signal (Vcntrl) to Msw. In this way the conduction through Msw is varied so that as the battery 3 reaches full charge the on-time of Msw can be gradually reduced until finally Msw is supplying only a maintenance (trickle) charge to the battery 3. In other embodiments the feedback loop from Rmeas to Vcntrl could be implemented in an entirely analog fashion, or in a mixed analog/digital fashion.

One significant drawback to the use and operation of this type of conventional charging circuit is that Rmeas is required to be a low ohmic value, high precision resistor. Due to the significant current flow through Rmeas it must also be large physically in order to dissipate the resulting heat. The use of a physically large resistor implies that a separate, discrete component be used, as opposed to an integrated component, which increases the cost as well as the complexity of the manufacturing and testing operations. Furthermore, Rmeas must be carefully located so as not to excessively heat adjacent circuit components. In addition, because of the low ohmic value of Rmeas the resulting voltage drop Vmeas is also small, which can require the use of high resolution ADC 4 to obtain an accurate measurement of Ich.

OBJECTS AND ADVANTAGES OF THE INVENTION

It is a first object and advantage of this invention to provide an improved battery energy management circuit.

It is another object and advantage of this invention to provide an improved battery charging circuit for use in a wireless terminal that overcomes the foregoing and other problems.

It is a further object and advantage of this invention to provide an improved battery discharging circuit for use in making battery capacity and other types of measurements.

SUMMARY OF THE INVENTION

The foregoing and other problems are overcome and the foregoing objects and advantages are realized by methods and apparatus in accordance with embodiments of this invention.

Disclosed herein is a method for charging a battery and circuitry for performing the method. The method includes steps of: (a) generating a charging current (Ich) for a battery; (b) generating a replica current (Irep) of Ich, where Irep=Ich/N, where N>1; (c) measuring a voltage drop induced by Irep across a measurement resistance; and (d) using the measured voltage drop for controlling a magnitude of Ich. Preferably N is greater than about 10, more preferably N is greater than about 100, and in the most preferred embodiment N is in a range of about 100 to about 1000. The step of generating the charging current (Ich) includes a step of operating a first device having an input node coupled to a source of charging current, the step of generating the replica current (Irep) includes a step of operating a second device having an input node coupled to the source of charging current; wherein the first device and the second device are both driven with the same control signal. The control signal may be a pulse width modulated signal having a pulse width that is controlled as a function of the measured voltage drop across the measurement resistance. The control signal may instead be a DC voltage with an adjustable voltage value that is controlled as a function of the measured voltage drop across the measurement resistance. In the preferred embodiment the step of generating the replica current (Irep) includes a step of operating a servo loop to force a potential appearing at an output node of the second device to equal a potential appearing at an output node of the first device.

A battery charging circuit in accordance with these teachings includes a first device driven by a control signal that controls the on and off times and/or the conduction through of the first device and, hence, the amount of charging current Ich supplied to the battery being recharged. The first device has an input node coupled to a source of charging current and an output node for coupling the charging current Ich to the battery to be recharged. The battery charging circuit further includes a second device that is driven by the control signal and that has an input node coupled to the source of charging current and an output node coupled to a measurement resistance. The voltage drop across the measurement resistance due to a current flow Irep through the measurement resistance is sensed for controlling the conduction of the first device.

Preferably Irep is equal to Ich/N, where N is a scaling factor that is greater than unity.

The circuit further includes a difference amplifier having a first input coupled to the output node of the first device, a second input coupled to the output node of the second device, and an output coupled to a control terminal of a transistor coupled in series with the measurement resistance. The difference amplifier operates the transistor for forcing a voltage potential appearing at the output node of the second device to be equal to a voltage potential appearing at the output node of the first device.

The measurement resistance can be coupled in series between the output node of the second device and an input node of the transistor, or the transistor can be is coupled in series between the output node of the second device and the measurement resistance.

The disclosed circuitry and method may be extended for providing a battery discharge measurement circuit for enabling a battery capacity test to be performed.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 2:
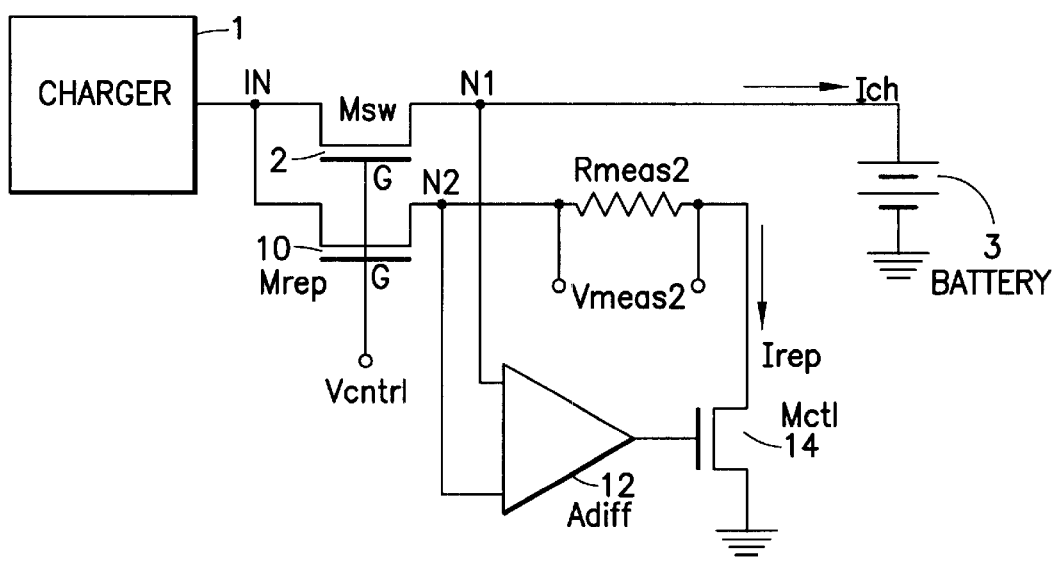
FIG. 2 is a circuit diagram, partially in block diagram form, that depicts a battery charger circuit in accordance with the teachings of this invention.

Reference is made now to FIG. 2 for showing a circuit diagram, partially in block diagram form, of a battery charger circuit in accordance with the teachings of this invention. Elements that are also found in FIG. I are numbered accordingly.

In FIG. 2 a scaled down replica of the charging current Ich, designated Irep, is generated with the aid of a servo-control circuit embodied as components Mrep 10, Adiff 12 and Mctl 14. The current Irep, not Ich, is passed through a measurement resistor Rmeas2. The replica of the charging current Irep is an accurate representation of the actual charging current Ich, as Msw 2 and Mrep 10 have the same terminal potentials at their respective input nodes, as well as at their respective output nodes (N1 and N2). That is, both of the transistors Msw 2 and Mrep 10 see the same voltage at their input terminal and at their gate (G) terminal (or Vcntl), and their respective outputs (N1 and N2) are at the same voltage potential due to the feedback formed by the servo-circuit. More particularly, the differential amplifier Adiff 12, which outputs a difference signal representing the difference between the potentials appearing at nodes N1 and N2, in combination with transistor Mctl 14, forces the potential at node N2 to equal the potential at node N1. As a result, Irep equals Ich/N, where N is a scaling factor or ratio that is described next.

The current scaling is achieved by reducing the size (the channel Width/Length ratio) of the current replicating transistor or device Mrep 10 by the scaling factor or ratio N with respect to the Width/Length ratio of the charging transistor or device Msw 2. In general, N is greater than unity. Preferably, N is greater than about 10, and more preferably is greater than about 100. Most preferably, the scaling factor or ratio (N) is in a range on the order of, for example, about 100 to about 1000.

Since the current scales linearly with the transistor channel geometry and assuming, by example, a scaling factor of 500: for a 200 mA charging current Ich the replication current Irep is only 400 micro amps (400 $\mu A$). This significant reduction in current flow through the measurement or sense resistance Rmeas2 enables a significantly larger ohmic value to be used for Rmeas2 (relative to the prior art circuit of FIG. 1), and further provides significantly less power dissipation. For example, a value of 1.5k$\Omega$ for Rmeas2 yields a value of 600 mV for Vmeas2, assuming a value for Irep of 400 $\mu A$. A 10-bit ADC 4 is thus clearly suitable for accurately digitizing the magnitude of Vmeas2.

This aspect of the invention thus also enables a significantly smaller sized physical resistance element to be employed. The use of a smaller physical resistor element enables the resistor to be integrated into, for example, an energy management integrated circuit, thereby eliminating the requirement to provide a separate physical resistor. When the integrated resistance is employed for Rmeas2 it may be desirable to provide either analog/resistor calibration or digital calibration of the output of the ADC 4.

In various embodiments of this invention the charging transistor Msw, the current replication transistor Mrep and the control device Mctl can be NMOS-type devices, or PMOS-type devices, and may further be either NPN or PNP devices. All of these variations can be made to function according to these teachings by providing the corresponding suitable polarity for the differential amplifier Adiff 12. The optimum choice of device type is, in general, application and semiconductor technology dependent.

Figure 1:
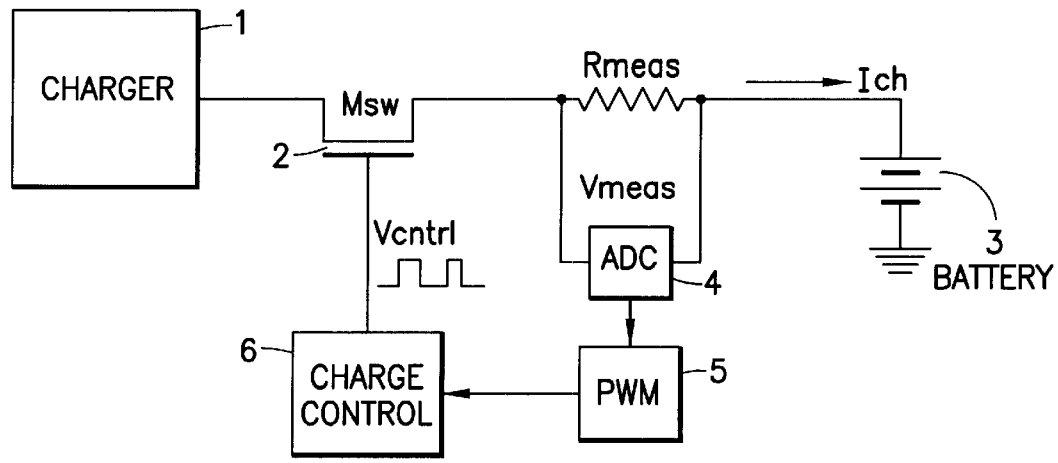
FIG. 1 is a circuit diagram, partially in block diagram form, that depicts a conventional battery charger arrangement.

In the embodiment shown in FIG. 2 a floating sense amplifier (not shown) is preferably employed for buffering Vmeas2 prior to application to the ADC 4 (shown in FIG. 1).

Figure 3:
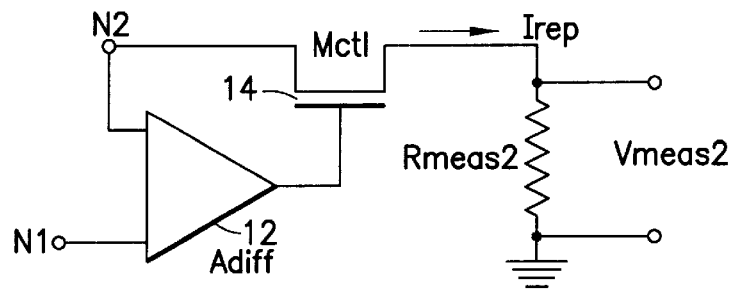
FIG. 3 shows an alternate configuration of the measurement resistor and servo loop transistor Mctl of FIG. 2.

The position of the measurement resistor Rmeas2 and the control device Mctl can also be interchanged to realize a single-ended measurement of Vmeas2, as depicted in the embodiment shown in FIG. 3.

The following Table is useful in explaining the distinctions between the conventional charger arrangement shown in FIG. 1 and the novel charger arrangement of FIG. 2.

TABLE

| Power dissipation in measurement resistors and AD conversion voltage range (FIG. 1) |
|---|
| Power dissipation in Rmeas: Pdis = Ich * Ich * Rmeas |
| Voltage range: Vrange = Ich * Rmeas |
| Power dissipation in measurement resistors and AD conversion voltage range (FIG. 2) |
| Power dissipation in Rmeas2: Pdis = Ich/N * Ich/N * Rmeas * M = Irep * Irep * Rmeas2 |
| Voltage range: Vrange = Ich/N * Rmeas * M = Irep * Rmeas2 |

In the presently preferred embodiment the power dissipation in the measurement resistor (Rmeas2) and the voltage range can be chosen independently using the scaling of the current replication transistor Mrep 10 (by N) and the measurement resistor Rmeas2 (by M). It is thus possible to simultaneously realize a low power dissipation and a wide voltage range by selecting the scaling factors accordingly. The low power dissipation in Rmeas2 enables a physically smaller sized external or integrated resistor to be used, while the increased measurement voltage range relaxes the offset and accuracy requirements of the sense amplifier and the ADC 4 converter. A suitable number of bits of resolution for the ADC 4 is 10 bits, although more or less than 10 bits can be employed.

Figure 4:
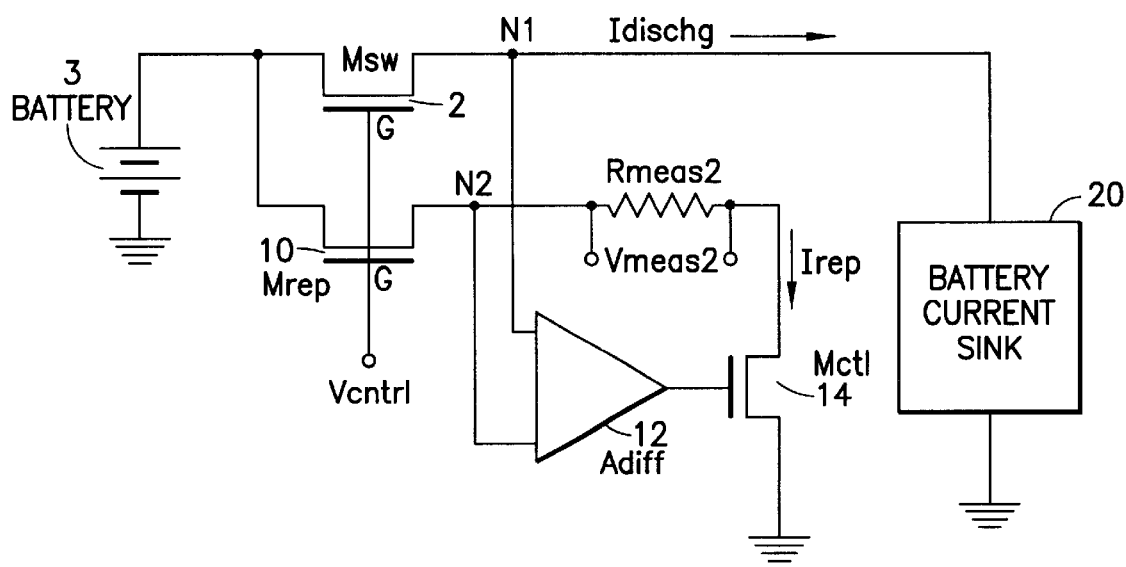
FIG. 4 is a circuit diagram, partially in block diagram form, that depicts a battery discharge circuit in accordance with the teachings of this invention.

Referring now to FIG. 4, it should further be appreciated that the teachings of this invention apply as well to techniques for performing a discharge test on the battery 3, wherein the battery 3 sources current towards a circuit to be powered 20 which functions as a current sink for the current sourced by the battery 3. In all other respects the discharge circuit can be constructed in accordance with the embodiment shown in FIG. 2, or in accordance with the single-ended measurement embodiment shown in FIG. 3. During the discharge test the measurement resistance Rmeas2 is used to sense the battery discharge current (Idisch), which is reflected in the magnitude of Vmeas2. The discharge current, in combination with a measurement of the voltage across the battery 3, is useful for predicting the amount of battery capacity that remains. In this embodiment the battery discharge current can be reduced during the discharge test, thereby conserving the remaining battery power.

It is pointed out that the charger transistor or device Msw and the replication transistor or device Mrep can be operated by Vcntrl in a switched fashion so that they are turned on and off by Vcntrl. However, it is also within the scope of these teachings to operate charger transistor or device Msw and the replication transistor or device Mrep in their linear modes (i.e., not switched off and on). In this case Vcntrl is generated as a DC voltage with am adjustable voltage value to vary the conduction through Msw and Mrep. However, this latter option may be less desirable for some applications, as operation in the linear mode will generally consume more power and generate more heat than operation in the switched mode, as is well known.

While the teachings of this invention have been described in the context of a battery charging circuit used in a wireless terminal, such as a cellular telephone or a personal communicator, those skilled in the art will appreciate that these teachings are not limited to only this one important application, but can instead be employed in a wide range of devices powered by a rechargeable battery, such as personal digital assistants, laptop and notebook computers, and various types of toys.

Thus, while the invention has been particularly shown and described with respect to preferred embodiments thereof, it will be understood by those skilled in the art that changes in form and details may be made therein without departing from the scope and spirit of the invention.

What is claimed is:

1. A battery charging circuit, comprising:
 a first device driven by a control signal and having an input node coupled to a source of charging current and an output node for coupling a charging current Ich to a battery to be recharged; and
 a second device driven by said control signal and having an input node coupled to said source of charging current and an output node coupled to a measurement resistance, wherein a voltage drop across said measurement resistance due to a current flow Irep through said measurement resistance is sensed for controlling current flow through said first device, and wherein Irep is equal to Ich/N, where N is a scaling factor that is greater than unity.

2. A battery charging circuit as in claim 1, and further comprising a difference amplifier having a first input coupled to said output node of said first device, a second input coupled to said output node of said second device, and an output coupled to a control terminal of a transistor coupled in series with said measurement resistance, said difference amplifier operating said transistor for forcing a voltage potential appearing at said output node of said second device to be equal to a voltage potential appearing at said output node of said first device.

3. A battery charging circuit as in claim 2, wherein said measurement resistance is coupled in series between said output node of said second device and an input node of said transistor.

4. A battery charging circuit as in claim 2, wherein said transistor is coupled in series between said output node of said second device and said measurement resistance.

5. A battery charging circuit as in claim 1, wherein N is greater than about 10.

6. A battery charging circuit as in claim 1, wherein N is greater than about 100.

7. A battery charging circuit as in claim 1, wherein N is in a range of about 100 to about 1000.

8. A battery charging circuit as in claim 1, wherein said measurement resistance is located within an integrated circuit.

9. A method for charging a battery, comprising steps of:
 generating a charging current (Ich) for a battery;
 generating a replica current (Irep) of Ich, where Irep=Ich/N, where N>1;
 measuring a voltage drop induced by Irep across a measurement resistance; and
 using the measured voltage drop for controlling a magnitude of Ich.

10. A method as in claim 9, wherein N is greater than about 10.

11. A method as in claim 9, wherein N is greater than about 100.

12. A method as in claim 9, wherein N is in a range of about 100 to about 1000.

13. A method as in claim 9, wherein the step of generating the charging current (Ich) comprises a step of operating a first device having an input node coupled to a source of charging current, wherein the step of generating the replica current (Irep) comprises a step of operating a second device having an input node coupled to the source of charging current; and wherein the first device and the second device are both driven with the same control signal.

14. A method as in claim 13, wherein the control signal is one of a pulse width modulated signal having a pulse width that is controlled as a function of the measured voltage drop across the measurement resistance or a DC voltage having an adjustable voltage value that is controlled as a function of the measured voltage drop across the measurement resistance.

15. A method as in claim 13, wherein the step of generating the replica current (Irep) comprises a step of operating a servo loop to force a potential appearing at an output node of the second device to equal a potential appearing at an output node of the first device.

16. A circuit for measuring a battery discharge current, comprising:
 a first device driven by a control signal and having an input node coupled to a battery to be discharge tested and an output node for coupling a battery discharge current Idisch to a current sink; and a second device driven by said control signal and having an input node coupled to said battery and an output node coupled to a measurement resistance, wherein a voltage drop across said measurement resistance due to a current flow Irep through said measurement resistance is equal to Ich/N, where N is a scaling factor that is greater than unity.

17. A battery discharge circuit as in claim 16, and further comprising a difference amplifier having a first input coupled to said output node of said first device, a second input coupled to said output node of said second device, and an output coupled to a control terminal of a transistor coupled in series with said measurement resistance, said difference amplifier operating said transistor for forcing a voltage potential appearing at said output node of said second device to be equal to a voltage potential appearing at said output node of said first device.

18. A battery discharge circuit as in claim 17, wherein said measurement resistance is coupled in series between said output node of said second device and an input node of said transistor.

19. A battery discharge circuit as in claim 17, wherein said transistor is coupled in series between said output node of said second device and said measurement resistance.

20. A battery discharge circuit as in claim 16, wherein N is greater than about 10.

21. A battery discharge circuit as in claim 16, wherein N is greater than about 100.

22. A battery discharge circuit as in claim 16, wherein N is in a range of about 100 to about 1000.

23. A battery discharge circuit as in claim 16, wherein said measurement resistance is located within an integrated circuit.

24. A battery discharge circuit as in claim 16, wherein the control signal is one of a pulse width modulated signal having a pulse width that is controlled as a function of the measured voltage drop across the measurement resistance or a DC voltage having an adjustable voltage value that is controlled as a function of the measured voltage drop across the measurement resistance.

25. A battery discharge circuit as in claim 16, and further comprising a servo loop for forcing a potential appearing at an output node of the second device to equal a potential appearing at an output node of the first device.

* * * * *